(12) United States Patent
Sakuma et al.

(10) Patent No.: US 7,227,251 B2
(45) Date of Patent: Jun. 5, 2007

(54) SEMICONDUCTOR DEVICE AND A MEMORY SYSTEM INCLUDING A PLURALITY OF IC CHIPS IN A COMMON PACKAGE

(75) Inventors: Kazuki Sakuma, Higashimurayama (JP); Masayasu Kawamura, Higashiyamato (JP); Yasushi Takahashi, Urawa (JP); Masachika Masuda, Tokorozawa (JP); Tamaki Wada, Higashimurayama (JP); Michiaki Sugiyama, Tokyo (JP); Hirotaka Nishizawa, Fuchu (JP); Toshio Sugano, Kodaira (JP)

(73) Assignee: Elpida Memory, Inc., Tokyo (JP)

( * ) Notice: Subject to any disclaimer, the term of this patent is extended or adjusted under 35 U.S.C. 154(b) by 217 days.

(21) Appl. No.: 11/114,175

(22) Filed: Apr. 26, 2005

(65) Prior Publication Data
US 2005/0184380 A1 Aug. 25, 2005

Related U.S. Application Data

(63) Continuation of application No. 09/453,171, filed on Dec. 2, 1999, now Pat. No. 6,885,092, which is a continuation-in-part of application No. 09/161,725, filed on Sep. 29, 1998, now Pat. No. 6,252,299.

(30) Foreign Application Priority Data

| Sep. 29, 1997 | (JP) | .................................... 9-263434 |
| May 22, 1998 | (JP) | ................................. 10-140878 |
| Nov. 26, 1998 | (JP) | ................................. 10-335351 |

(51) Int. Cl.
*H01L 23/02* (2006.01)
*H01L 23/48* (2006.01)
*G11C 8/00* (2006.01)

(52) U.S. Cl. .............................. 257/686; 257/E23.039; 257/E23.042; 257/E23.052; 257/685; 257/666; 257/723; 257/777; 257/728; 257/724; 257/725; 257/48; 257/673; 257/786; 257/784; 257/696; 257/698; 365/233

(58) Field of Classification Search ................ 257/686, 257/685, E23.039, E23.042, E23.052, 723–725, 257/728, 673, 666, 696, 698, 777, 784, 786, 257/48
See application file for complete search history.

(56) References Cited

U.S. PATENT DOCUMENTS 5,227,995 A  7/1993 Klink et al.

(Continued)

FOREIGN PATENT DOCUMENTS

JP    56-137665    10/1981

(Continued)

OTHER PUBLICATIONS

Communication from Chinese Patent Office (Chinese Office Action) dated Jul. 21, 2006 w/ English translation.

*Primary Examiner*—Alexander Oscar Williams
(74) *Attorney, Agent, or Firm*—Antonelli, Terry, Stout & Kraus, LLP.

(57) ABSTRACT

A semiconductor device is formed by laminating two semiconductor chips with the rear surfaces thereof provided face to face. Each semiconductor chip is provided with an outer lead for clock enable to which the clock enable signal and chip select signal are individually input. On the occasion of making access to one semiconductor chip, the other semiconductor chip is set to the low power consumption mode by setting the clock enable signal and chip select signal to the non-active condition.

10 Claims, 9 Drawing Sheets

| U.S. PATENT DOCUMENTS | | | | FOREIGN PATENT DOCUMENTS | | |
|---|---|---|---|---|---|---|
| 5,296,737 | A | 3/1994 | Nishimura et al. | JP | 02-246125 | 10/1990 |
| 5,299,092 | A | 3/1994 | Yaguchi et al. | JP | 05-109801 | 4/1993 |
| 5,572,068 | A | 11/1996 | Chun | JP | 05-109976 | 4/1993 |
| 5,612,569 | A | 3/1997 | Murakami et al. | JP | 05-136332 | 6/1993 |
| 5,637,828 | A | 6/1997 | Russell et al. | JP | 05-218295 | 8/1993 |
| 5,801,451 | A | 9/1998 | Yamauchi | JP | 05-283606 | 10/1993 |
| 5,815,372 | A | 9/1998 | Gallas | JP | 05-315540 | 11/1993 |
| 6,172,932 | B1 | 1/2001 | Cha et al. | JP | 07-058281 | 3/1995 |
| 6,215,192 | B1 | 4/2001 | Hirata et al. | JP | 758281 | 3/1995 |
| 6,242,285 | B1 | 6/2001 | Kang | JP | 786526 | 3/1995 |
| 2001/0009505 | A1 | 7/2001 | Nishizawa et al. | WO | WO 91/14282 | 9/1991 |

(TOP VIEW)

SEMICONDUCTOR DEVICE AND A MEMORY SYSTEM INCLUDING A PLURALITY OF IC CHIPS IN A COMMON PACKAGE

This application is a continuation of U.S. application. Ser. No. 09/453,171. filed Dec. 2, 1999 now U.S. Pat. No. 6,885,092, which, in turn, is a continuation-in-part application of U.S. Ser. No. 09/161,725, filed on Sep. 29, 1998 now U.S. Pat. No. 6,252,299 to M. Masuda et al., the disclosures of which are incorporated herein by reference.

BACKGROUND OF THE INVENTION

In these years, an improvement for large capacity of memory is now continuously made in a semiconductor device such as DRAM (Dynamic Random Access-Memory) and size of semiconductor chip is also increasing corresponding to such large capacity.

As the technology for loading such large size semiconductor chip, the LOC (Lead On Chip) method has been proposed in which an end part of a lead frame is located, for example, at an upper side of a semiconductor chip.

Meanwhile, the LOC method has proposed, in order to realize large capacity, a semiconductor device introducing the structure in which a couple of semiconductor chips forming DRAM of the same capacity are laminated and these semiconductor chips are sealed by the identical resin sealing material.

This semiconductor device (memory system) has a structure that the semiconductor chips are laminated with the circuit forming surfaces provided opposed with each other and a lead is divided to two branching leads divided to upper and lower leads at an inside of a resin sealing material.

One branching lead among two branching leads is bonded and fixed to a circuit forming surface of one semiconductor chip via an insulating film and is connected to an external terminal of the circuit forming surface via the bonding wire.

Moreover, two branching leads are respectively formed of different members in which one branching lead is guided to an external side of the resin sealing material and is then integrated with an external lead formed in a predetermined shape, while the other lead is joined with the one branching lead at the inside of the resin sealing material and connected electrically and mechanically.

That is, the lead (external terminal) extending at the inside and outside of the resin sealing material is composed of the external lead guided to the external side of the resin sealing material, one branching lead integrated to this external lead and the other branching lead joined with one branching lead.

Such semiconductor device is explained in detail in the Japanese Unexamined Patent Publication No. HEI 7-58281.

Following references have been found by the search for cited reference after completion of the present invention by the inventors thereof.

That is, the Japanese Unexamined Patent Publication No. HEI 9-246465 (corresponding U.S. Pat. No. 5,804,874) discloses a laminated chip package for selecting only one chip from two laminated memory chips with the control signals RAS0 and RAS1.

The Japanese Unexamined Patent Publication No. HEI 7-86526 discloses a package including two memory integrated circuits to avoid collision of I/O signals by setting only one memory integrated circuit to an active condition with a CE terminal.

The Japanese Unexamined Patent Publication No. HEI 4-302165 (corresponding U.S. Pat. No. 5,211,485) discloses a semiconductor memory device in which first and second semiconductor memory elements having the same function are fixed on the front and rear surfaces of a tab, these two memory elements are respectively provided with a means for giving an output impedance control signal and a data input/output operation activating signal and also commonly provided with a means for giving the control signal and data input/output signal power source other than the output impedance control signal and the data input/output operation activating signal.

The Japanese Unexamined Patent Publication No. HEI 3-181163 (corresponding U.S. Pat. No. 5,512,783) discloses a semiconductor chip package including an external case providing, at the inside thereof, one or a plurality of semiconductor chips sealed in the capsule and having four chip selection pins (CS0 to CS3), two write acknowledgment pins (WE0 to WE1) and two output acknowledgment pins (OE0 to OE1).

SUMMARY OF THE INVENTION

The inventors of the present invention have found that the semiconductor device explained above has following problems.

That is, the two branching leads explained above are provided between two laminated semiconductor chips and the bonding wires are connected respectively at the bonding surfaces of the semiconductor chips where the branching leads are provided opposed with each other. Therefore, an interval of two semiconductor chips is widened as much as an interval of two branching leads, resulting in increase of thickness of resin sealing material to provide a thick semiconductor device.

Moreover, since two branching leads exist between two semiconductor chips, floating capacity (chip to lead capacity) generated at the respective semiconductor chips is added respectively to two branching leads. Thereby, signal propagation rate of respective branching leads drops and electrical characteristic of semiconductor device is lowered.

It is therefore an object of the present invention to provide a semiconductor device which has reduced thickness of a resin sealing material and remarkably improved a electrical characteristic thereof.

The above-mentioned and the other objects and novel characteristic of the present invention will become apparent from the detail description of the present specification and the accompanying drawings thereof.

Summary of typical characteristics disclosed in the present invention are as follow.

That is, the semiconductor device of the present invention comprises a resin sealing material, two semiconductor (memory) chips located at the inside of the resin sealing material to form external terminals at the circuit forming surface and lead extending at the internal and external sides of the resin sealing material. The lead is branched to two branching leads at least at the inside of the resin sealing material, the branching one lead is fixed to the circuit forming surface of one semiconductor chip and connected to the external terminal of the circuit forming surface and the other lead is connected to the external terminal of the surface. The two semiconductor chips are laminated with the rear surfaces provided face to face and the chip control lead is also provided so that a clock enable signal (chip control signal) is individually input to set two semiconductor chips to the lower power consumption mode.

Moreover, the semiconductor device of the present invention comprises a resin sealing material, two semiconductor chips located at the inside of the resin sealing material forming external terminal at the circuit forming surface and lead extended to the inside and outside of the resin sealing material. The lead is branched to two branching leads at least within the resin sealing material, one branching lead is fixed to the circuit forming surface of one semiconductor chip and is connected to the external terminal of the circuit forming surface via a conductive wire, the other branching lead is fixed to the circuit forming surface of the other semiconductor chip and is connected to the external terminal of the circuit forming surface via the conductive wire, two semiconductor chips are laminated with the rear surfaces provided face to face and a chip control lead for individually inputting the clock enable signal (chip control signal) for setting two semiconductor chips to the low power consumption mode respectively is also provided.

In addition, the semiconductor device of the present invention uses a chip control signal, to be input to the chip control lead, consisting of chip select signal for selecting a semiconductor chip.

Moreover, the semiconductor device of the present invention uses a chip control signal, to be input to the chip control lead, consisting of the clock enable signal allowing the clock input.

In addition, the semiconductor device of the present invention uses the chip control signal, to be input to the chip control lead, consisting of the chip select signal for selecting semiconductor chip and clock enable signal allowing the clock input.

Because of the reason explained above, since the two semiconductor chips are laminated with the rear surface provided opposed with each other, an interval between the two semiconductor chips may be narrowed and thereby the thickness of semiconductor device may be reduced.

Moreover, since the leads are not required to be formed between the semiconductor chips, the floating capacity of the lead can remarkably be reduced and electrical characteristic of semiconductor device may also be improved.

Moreover, since the other semiconductor chip can be set to the low power consumption mode while access is being made to one semiconductor chip, power consumption of semiconductor device can remarkably be lowered.

Any cited reference explained above does not disclose the technology that the clock signal is given in common to each semiconductor chip in the memory system providing a plurality of semiconductor memory chips and the signal for controlling each semiconductor memory chip is individually given to each semiconductor memory chip.

In the present invention, meanwhile, the clock signal is given in common to each semiconductor chip in the memory system having a plurality of semiconductor memory chip and the signal for controlling each semiconductor memory chip is given individually to each semiconductor memory chip. Therefore, it is now possible to selectively operate, in the low power consumption mode, the semiconductor memory chip not accessed in the memory system operating with the clock signal and accordingly low power consumption of the memory system can be realized.

DETAILED DESCRIPTION OF THE INVENTION

A preferred embodiment of the present invention will be explained in detail with reference to the accompanying drawings.

Figure 1:
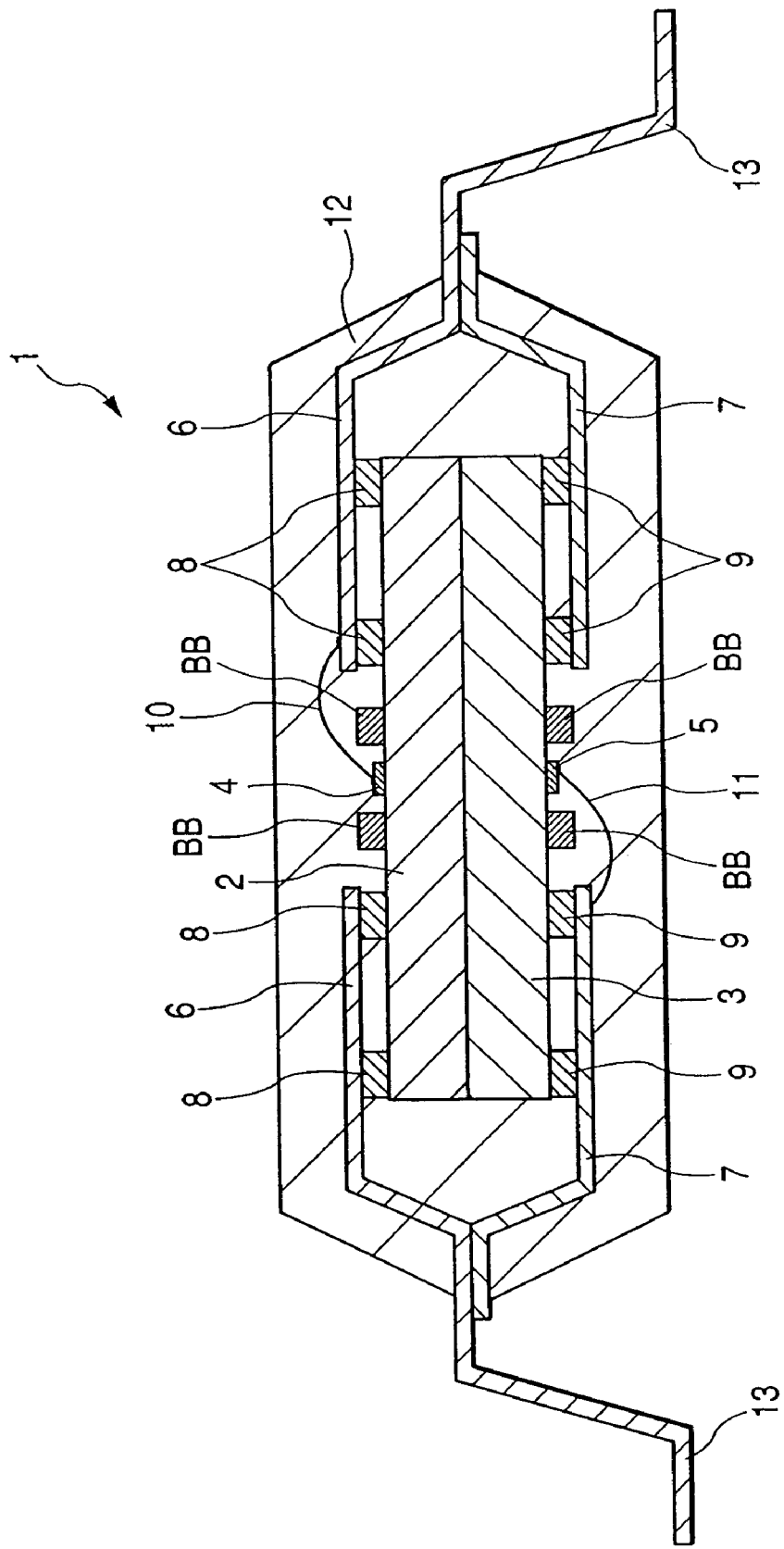
FIG. 1 is a cross-sectional view of a semiconductor device of a first embodiment of the present invention.
Figure 2:
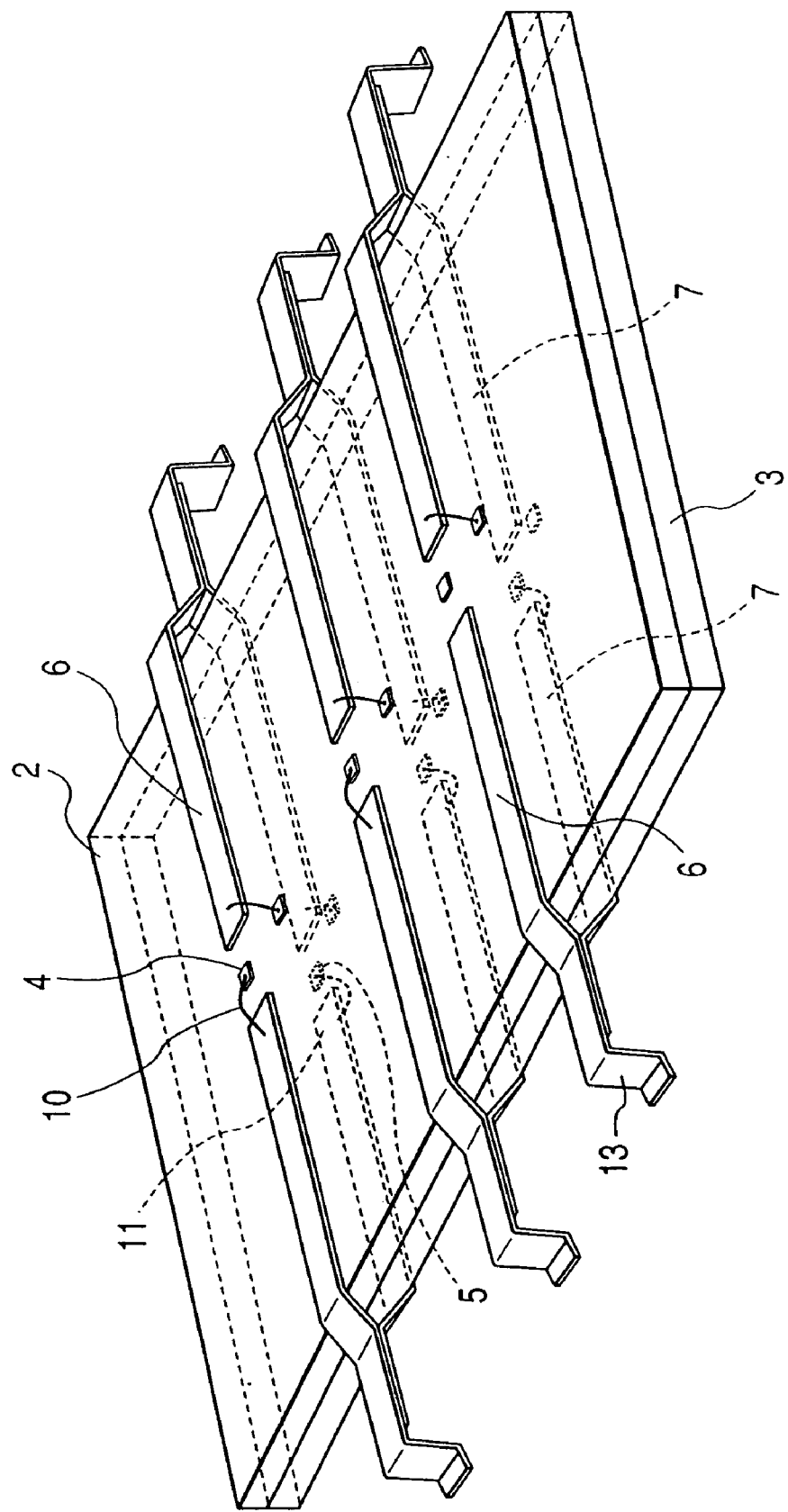
FIG. 2 is a perspective view of the concept in which the resin sealing material of the semiconductor device of the first embodiment of the present invention is removed.
Figure 3:
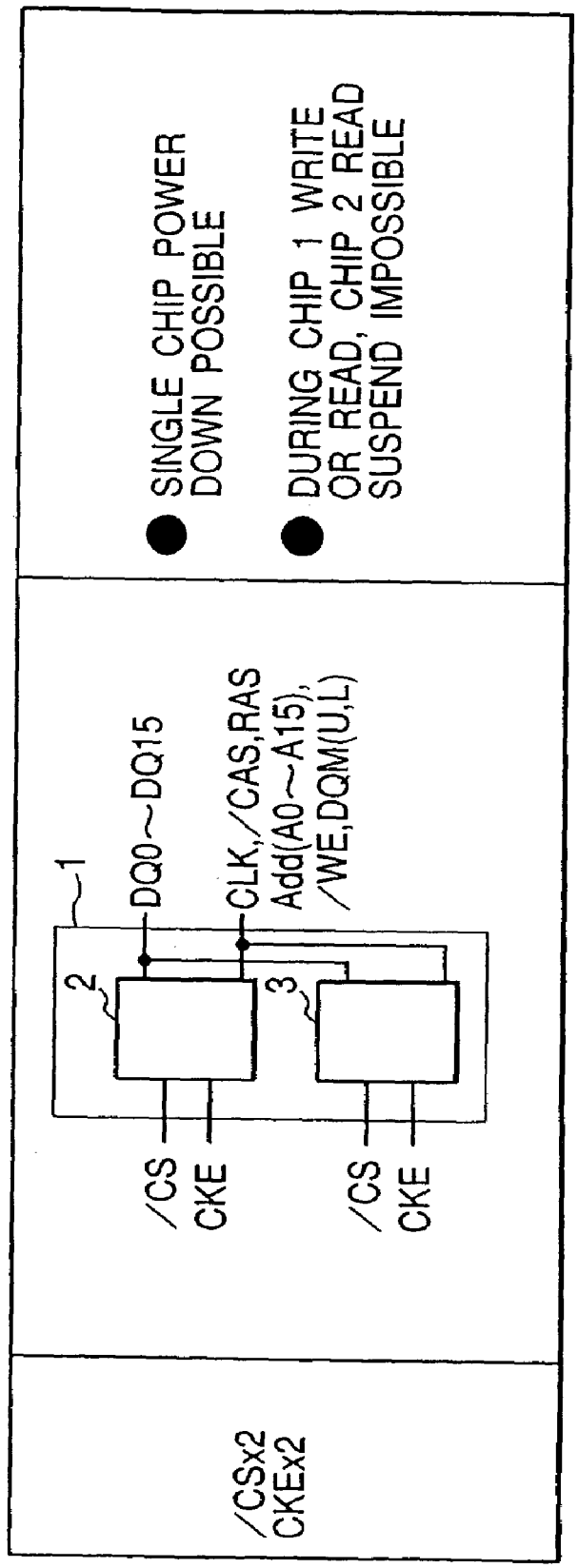
FIG. 3 is a block diagram illustrating an internal line condition of the semiconductor device of the first embodiment of the present invention and explaining the possible operation.
Figure 4:
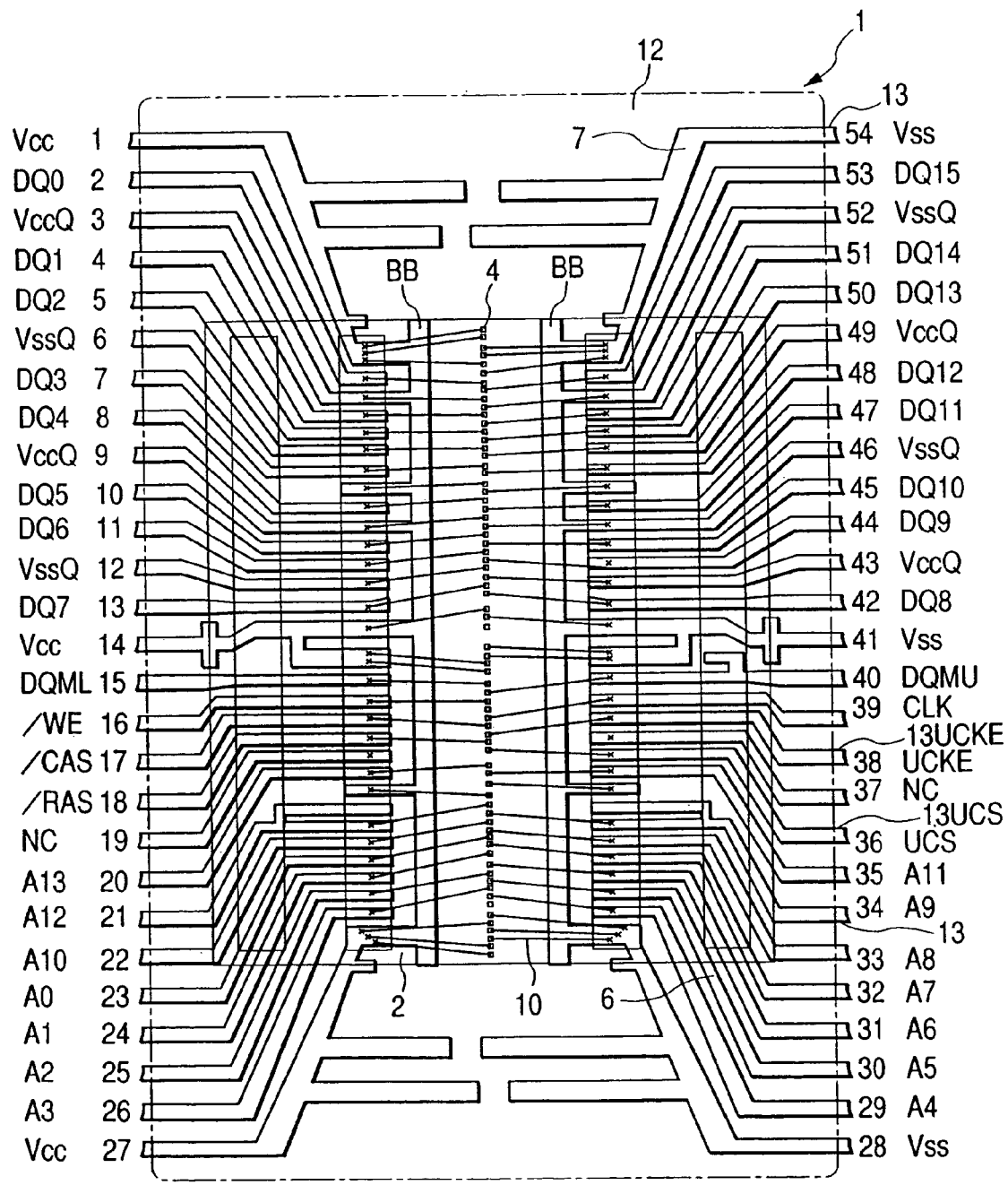
FIG. 4 is a diagram for explaining layout of the internal structure in the semiconductor chip side laminated at the upper part of the semiconductor device of the first embodiment of the present invention.
Figure 5:
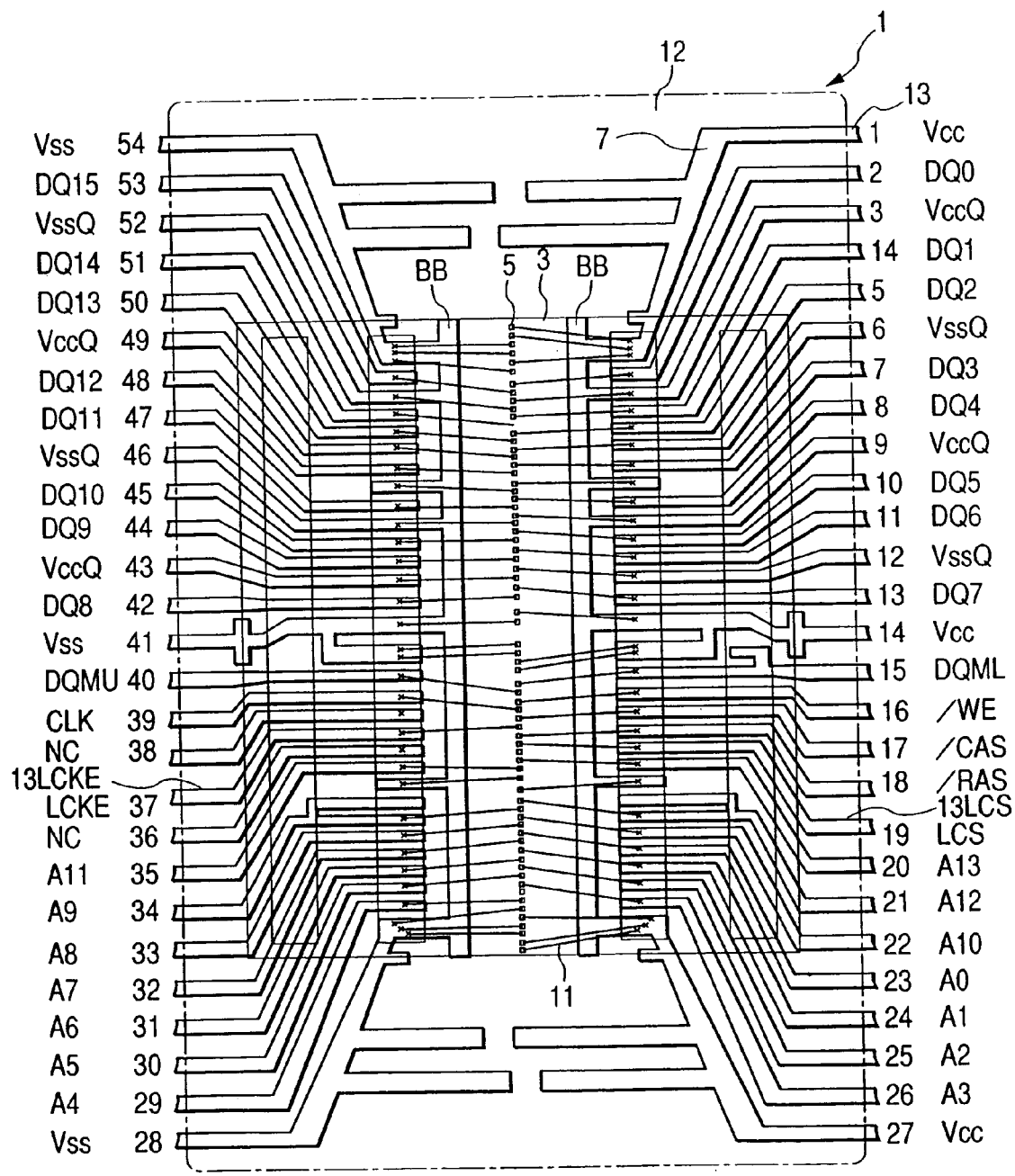
FIG. 5 is a diagram for explaining layout of internal structure in the semiconductor chip side laminated at the lower part of the semiconductor device.
Figure 6:
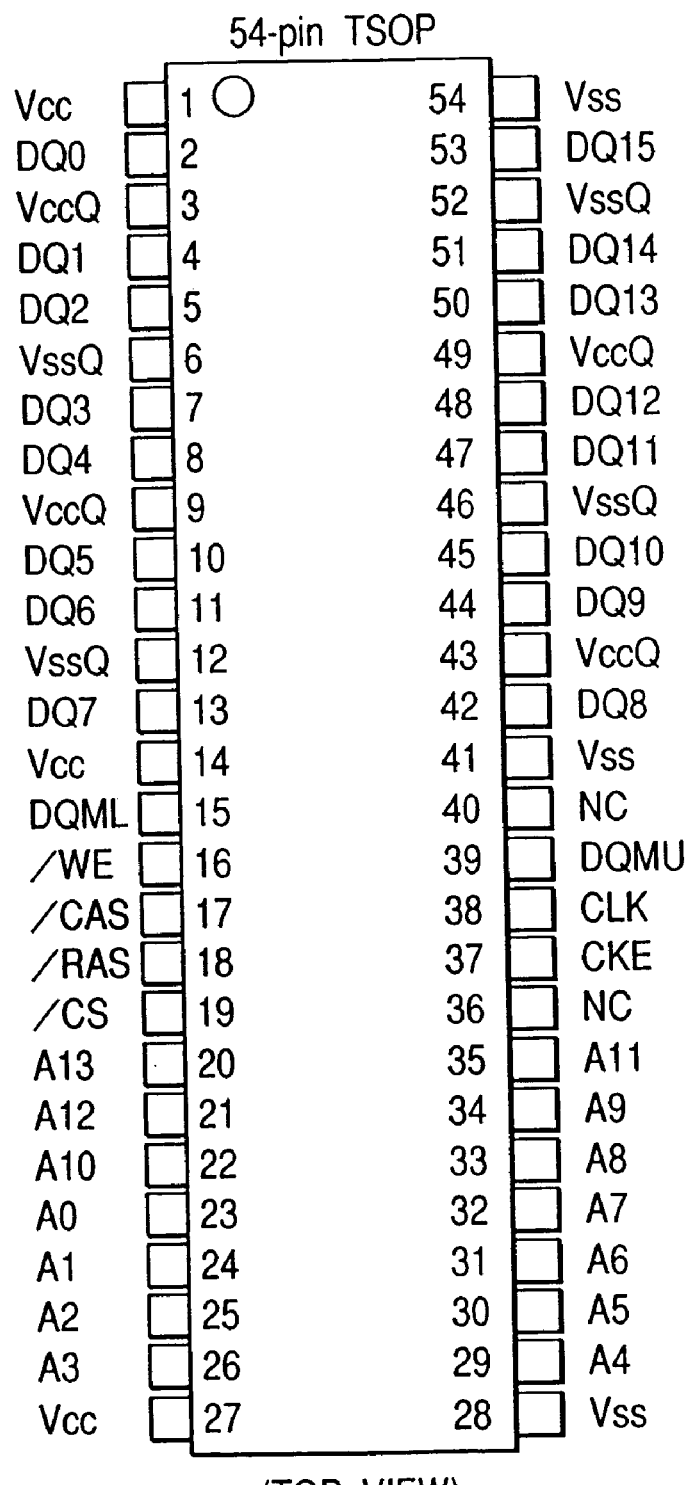
FIG. 6 is a diagram for explaining standard pin arrangement of SDRAM having the bit structure of 16 bits determined by JEDEC.

FIG. 1 is a cross-sectional view of a semiconductor device (or memory system or DDP (Double Density Package)) of a preferred embodiment of the present invention. FIG. 2 is a perspective view of the concept where a resin sealing material of the semiconductor device of the preferred embodiment of the present invention is eliminated. FIG. 3 is a block diagram illustrating the internal line condition of the semiconductor device of the preferred embodiment of the present invention and explaining the possible operation. FIG. 4 is a diagram illustrating layout of internal structure in the semiconductor chip side laminated at the upper part of the semiconductor device of the first embodiment of the present invention. FIG. 5 is a diagram for explaining layout of the internal structure in the semiconductor chip side laminated in the lower part of the semiconductor device. FIG. 6 is a diagram illustrating standard pin arrangement of SDRAM having the bit structure of 16 bits determined by JEDEC.

In this embodiment, a semiconductor device 1 of TSOP (Thin Small Out-line Package) type as a kind of the surface loading package is formed of S (Synchronous) DRAM having the word×bit structure, for example, of 8 M×16 bits.

As illustrated in FIG. 1 and FIG. 2, the semiconductor device 1 has a structure that two semiconductor chips 2, 3 having the word×bit structure of 4 M×16 bits are laminated.

The semiconductor chips 2, 3 are laminated at the entire part of the rear surfaces where any circuit is never formed and are then bonded by a bonding material such as polyimide. These semiconductor chips 2, 3 are laminated in the same upper and lower side directions of chips.

Moreover, at the center of the circuit forming surfaces of the semiconductor chips 2, 3, the bonding pads (external terminals) 4, 5 as the electrodes are respectively arranged in the long side direction of the semiconductor chips 2, 3.

At the circuit forming surface of the semiconductor chip 2, an inner lead (lead) 6 is bonded via the insulating film 8 and the end part of the inner lead 6 is located at the area near the bonding pad 4 of the semiconductor chip 2.

In the same manner, the inner lead (lead) 7 is also bonded to the circuit forming surface of the semiconductor chip 3 via the insulating film 9 and the end part of inner lead 6 is located at the area near the bonding pad 5 of the semiconductor chip 3.

Moreover, between the bonding pads 4, 5 and inner leads 6, 7, the lead for supplying the power source voltage which becomes the operating voltage of the semiconductor device 1 and a bus bar BB as the lead to supply the reference potential are respectively provided in the longitudinal direction of the semiconductor chips 2, 3.

The inner lead 6 is connected with the bonding pad formed to the semiconductor chip 2 via the bonding wire (wire) 10 and the inner lead 7 is connected with the bonding pad 5 formed to the semiconductor chip 3 via the bonding wire (wire) 11. Moreover, the bonding pads 4, 5 to which the power source voltage or reference potential is supplied is connected with a bus bar BB via the bonding wires 10, 11.

The inner leads 6, 7 are respectively formed of individual members and the inner lead 7 is electrically and mechanically connected with the inner lead 6 within the resin sealing material 12, for example, through the joining by the laser welding. The inner lead 6 connected to the inner lead 7 is then guided to the external side of the resin sealing material 12 to become the outer lead (lead) 13 formed in the predetermined shape.

Here, the line condition of the semiconductor chips 2, 3 of the semiconductor device 1 is illustrated in the block diagram of FIG. 3. As illustrated in FIG. 3, the input/output signals DQ0 to DQ15, address signals A0 to A13, a clock signal CLK as the data, a row address strobe signal/RAS, a column address strobe signal/CAS, a write enable signal/WE, mask signals DQMU, DQML as the control signals are input in common even in any semiconductor chips 2, 3 and a clock enable signal (chip control signal) CKE, a chip select signal (chip control signal) /CS as the control signals are also input independently to the semiconductor chips 2, 3.

Next, operation of this embodiment will be explained.

First, in the semiconductor device 1, the input/output signals DQ0 to DQ15, address signals A0 to A13, clock signal CLK and row address strobe signal/RAS, column address strobe signal/CAS, write enable signal/WE, mask signals DQMU, DQML as the control signals are input in common to the predetermined bonding pads 4, 5 and inner leads 6, 7 of the semiconductor chips 2, 3 via the outer lead 13 through the bonding wires 10, 11.

On the other hand, the outer lead 13 to which clock signal CKE and chip select signal/CS as the two control signals are input is respectively provided individually with the exclusive outer lead 13.

For example, the clock enable signal CKE is classified into the clock enable signal UCKE input to the semiconductor chip 2 and the clock enable signal LCKE input to the semiconductor chip 3, and the outer lead 13 of the semiconductor device 1 is provided with the outer lead (chip control lead) $13_{UCKE}$ for clock enable to which the clock enable signal UCKE is input and the outer lead (chip control lead) $13_{LCKE}$ for clock enable to which the clock enable signal LCKE is input.

As illustrated in FIG. 4, the outer lead $13_{UCKE}$ for clock enable is provided for 38 pins of the semiconductor device 1, while the outer lead $13_{LCKE}$ for clock enable is provided at the position of the 37 pins of the semiconductor device as illustrated in FIG. 5.

Moreover, the chip select signal/CS is classified into the chip select signal UCS input to the semiconductor chip 2 and the chip select signal LCS input to the semiconductor chip 3. The outer lead 13 of the semiconductor device is provided with the outer lead (chip control lead) $13_{UCS}$ for chip select to which the chip select signal UCS is input and the outer lead (chip control lead) $13_{LCS}$ for chip select to which the chip select signal LCS is input.

The outer lead $13_{UCS}$ for chip select is provided, as illustrated in FIG. 4, to the 36 pins of the semiconductor device 1, while the outer lead $13_{LCS}$ for chip select is provided, as illustrated in FIG. 5, to the position of 19 pins of the semiconductor device 1.

Here, FIG. 6 illustrates the standard pin arrangement in the semiconductor device with the total number of pins of 54 pins determined by JEDEC (Joint Electron Device Engineering Council) when the present application has been presented.

In JEDEC, the clock signal CLK is input to 38 pins in FIG. 6, but since the outer lead $13_{UCKE}$ for clock enable is assigned for the semiconductor device 1 as explained above, the pin to which the clock signal CLK is input is assigned to the adjacent 39 pins.

Moreover, although the mask signal DQMU is input to the 39 pins in JEDEC, since the pins are assigned for the input of clock signal CLK in the semiconductor device 1, the pins to which the mask signal DQMU is input are assigned to the position of the NC (No Connection) pins of 40 pins in the JEDEC.

In addition, the clock enable signal CKE is input to 37 pins in JEDEC but the outer lead $13_{LCKE}$ for clock enable to which the clock enable signal LCKE is input is assigned in the semiconductor device 1.

In the JEDEC, the NC pin is composed of 36 pins and the outer lead $13_{UCS}$ for chip select to which the chip select signal UCS is input is assigned in the semiconductor device 1.

In the JEDEC, the chip select signal/CS is input to the 19 pins and the chip select signal LCS is assigned in the semiconductor device 1 (or memory system or DDP (Double Density Package)).

Therefore, the outer lead $13_{UCS}$ for chip select and outer lead $13_{UCKE}$ for clock enable of 36 pins and 38 pins are connected only to the predetermined bonding pad 4 of the semiconductor chip 2 from the inner lead 6 via the bonding wire 10, while the outer lead $13_{LCS}$ for chip select and outer lead $13_{LCKE}$ for clock enable of 37 pins and 19 pins are connected only to the predetermined bonding pad 5 of the semiconductor chip 3 via the bonding wire 11 from the inner lead 6.

On the occasion of making access to the semiconductor chip 2, the chip select signal UCS as the chip select signal/CS to be input to the semiconductor chip 2 is set to the low level (enable level), while the clock enable signal UCKE as the clock enable signal CKE is set to the high level (enable level).

Meanwhile, as illustrated in the right side of FIG. 3, power down mode which is one of the low power consumption mode can be attained by inputting the high level (disable level) chip select signal LCS and low level (disable level) clock enable signal LCKE to the semiconductor chip 3 not accessed.

In addition, in the case of making access to the semiconductor chip 3, the chip select signal LCS to be input to the semiconductor chip 3 is set to low level, while the clock enable signal LCKE is set to high level.

The power-down mode can be attained by respectively inputting the chip select signal UCS of high level and the clock enable signal UCK of low level to the semiconductor chip 2 not accessed.

Thereby, in this embodiment, since the semiconductor chips 2, 3 are laminated with the rear surfaces provided face to face, an interval between two semiconductor chips 2 and 3 can be narrowed and thickness of the semiconductor device 1 can be reduced.

In addition, since it is no longer required to respectively form the inner leads 6, 7 between the semiconductor chips 2 and 3, the floating capacity of inner leads 6, 7 can remarkably be reduced to improve electrical characteristic of the semiconductor device 1.

Moreover, since the chip select signal and clock enable signal can independently be applied to the semiconductor chips 2, 3, only one semiconductor chip not accessed can be set to the power-down mode and thereby the power consumption of the semiconductor device 1 can be reduced to a large extent.

In addition, in this embodiment, a couple of control signals of chip select signal/CS and clock enable signal CKE are individually input to the semiconductor chips 2, 3 but it is also possible to individually input any one signal to the semiconductor chips 2, 3 and then also input in common the other signal.

Figure 7:
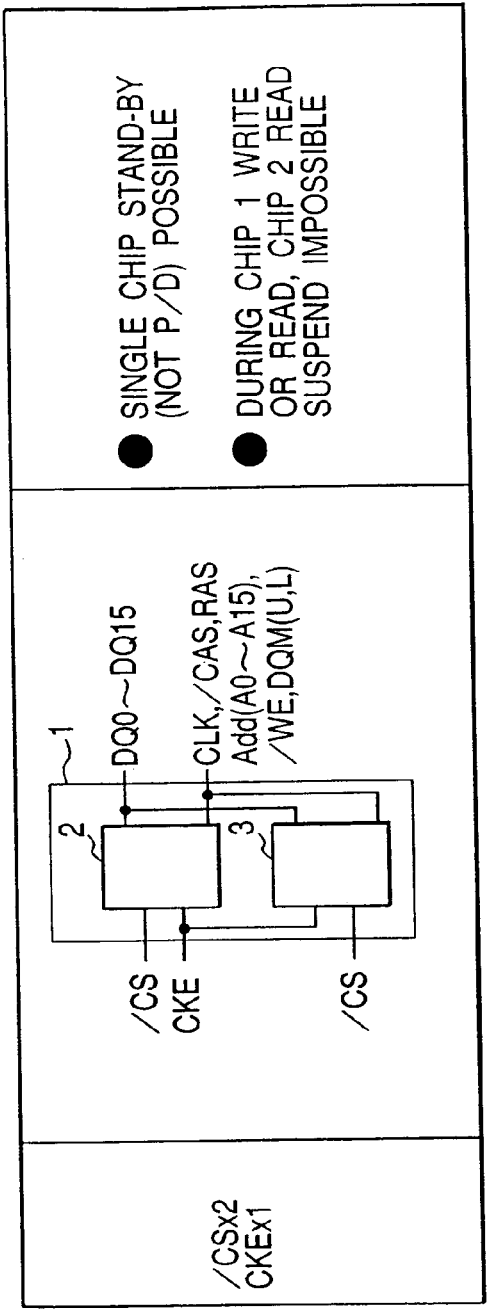
FIG. 7 is a block diagram illustrating an internal line condition of semiconductor device of the other embodiment of the present invention and explaining the possible operation.

For example, as is illustrated in the block diagram of FIG. 7, the clock enable signal CKE is input in common the chip select signal/CS is input individually as the independent chip select signal UCS to the semiconductor chip 2 and the chip select signal LCS to the semiconductor chip 3.

When access is made to the semiconductor chip 2 but not to the semiconductor 3, the low level (enable level) chip select signal UCS and high level (enable level) clock enable signal CKE are input to the semiconductor chip 2, while the high level (disable level) chip select signal LCS and high level (enable level) clock enable signal CKE are input to the semiconductor chip 3.

Accordingly, since the high level (disable level) chip select signal LCS is input to the semiconductor chip 3, the chip is set to the standby mode which is one of the lower power consumption mode and therefore power consumption can be lowered.

For example, the chip selection signal (chip enable signal) /CS is the signal for allowing activation of respective operations including data input or output when this chip selection signal is in the enable level. When the chip selection signal is in the disable level, various operations are set to the non-active condition and therefore the standby mode is set in which the power consumption is lowered.

Figure 8:
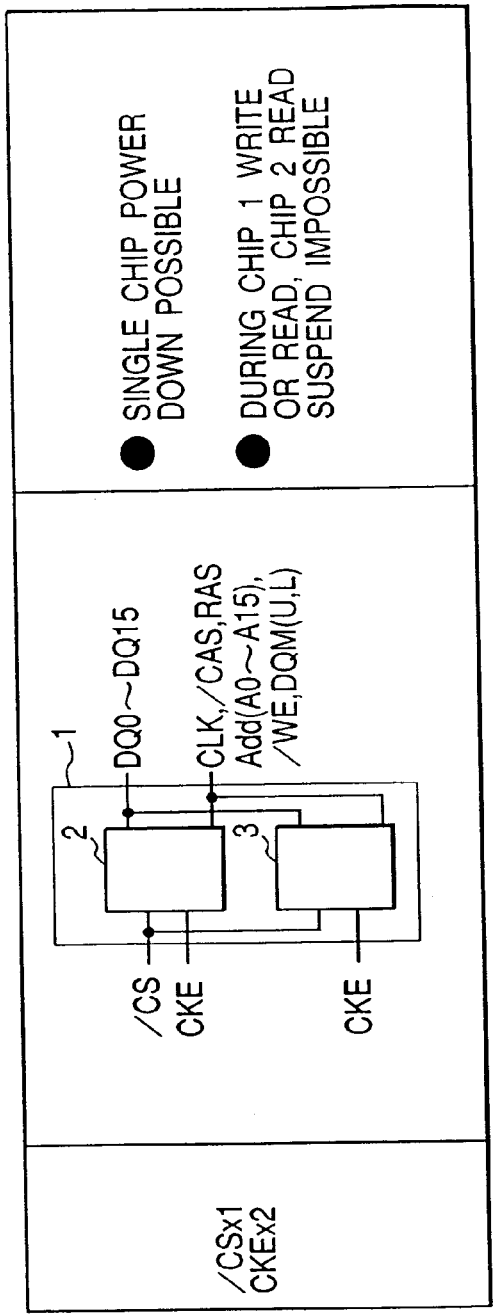
FIG. 8 is a block diagram illustrating the internal line condition of semiconductor device of the other embodiment of the present invention and explaining the possible operation.

Moreover, as illustrated in the block diagram of FIG. 8, the clock enable signal CKE is individually input as the independent clock enable signal UCKE to be input to the semiconductor chip 2 and the clock enable signal LCKE to be input to the semiconductor chip 3, and the chip select signal/CS is input in common.

When access is made to the semiconductor chip 2 but not to the semiconductor chip 3, the low level (enable level) chip select signal/CS and high level (enable level) clock enable signal UCKE are input to the semiconductor chip 2, while the low level (enable level) chip select signal/CS and low level (disable level) clock enable signal LCKE are input to the semiconductor chip 3.

Therefore, since the low level (disable level) clock enable signal LCKE is input to the semiconductor chip 3, the power-down mode which is one of the low power consumption mode is set and the current dissipation can also be lowered as illustrated in the right side of FIG. 8.

For example, the clock enable signal CKE is defined as the signal for enabling the clock signal. Moreover, this signal is used to set the semiconductor chip (SDRAM) to the low power condition. When the semiconductor chip is set to the low power condition by the clock enable signal CKE, all internal banks are set to the precharge condition (IDLE condition). When all internal banks are set to the precharge condition, the clock enable signal CKE is used as the gate signal of the input buffer of semiconductor chip. During power-down mode (low power condition) of semiconductor chip, the memory cell is never refreshed. Therefore, in the power-down mode, it is possible to apply the minimum refresh specification.

When any one signal among these two control signals is input individually to the semiconductor chips 2, 3 and the other signal is input in common, it is enough to assign only one signal of those input individually to the NC pin. Therefore, pin assignment can be made without changing the standard pin arrangement of JEDEC (FIG. 6).

Moreover, when two control signals are individually input to the semiconductor chips 2, 3 in this embodiment, pin arrangement of semiconductor chip 1 can be set to the standard arrangement of JEDEC by changing the forming position of the bonding pads 4, 5 of semiconductor chips 2, 3 and then assigning the increased two pins to the NC pin of JEDEC.

Figure 9:
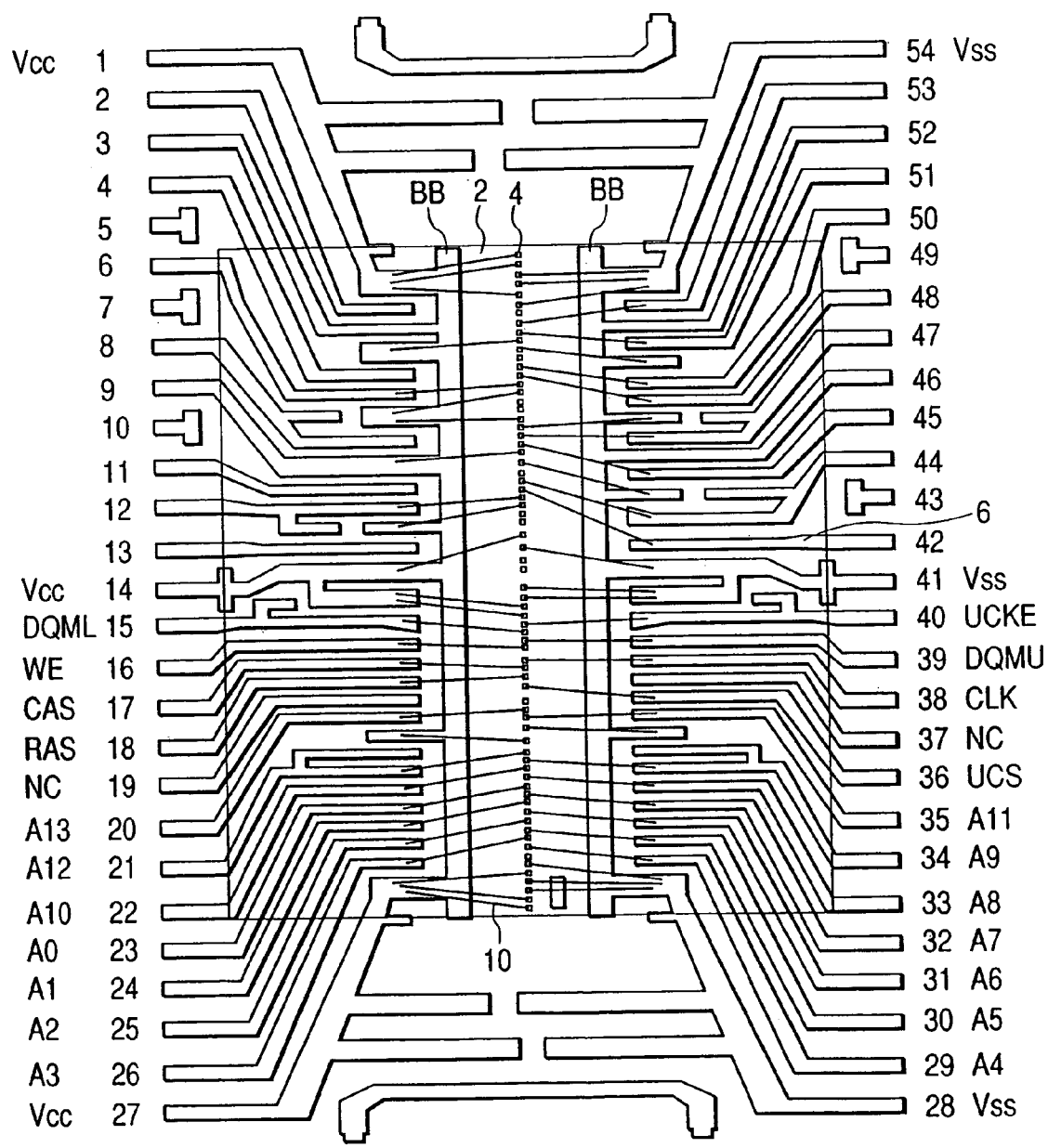
FIG. 9 is a diagram for explaining a layout of the internal structure in the semiconductor chip side laminated at the upper part of the semiconductor device of the other embodiment of the present invention.

For example, in the semiconductor chip 2, as illustrated in FIG. 9, the bonding pad 4 is formed so that the clock enable signal UCKE is assigned to the NC pin of 40 pins of JEDEC and the chip select signal UCS is assigned to the NC pin of 36 pins of JEDEC.

Figure 10:
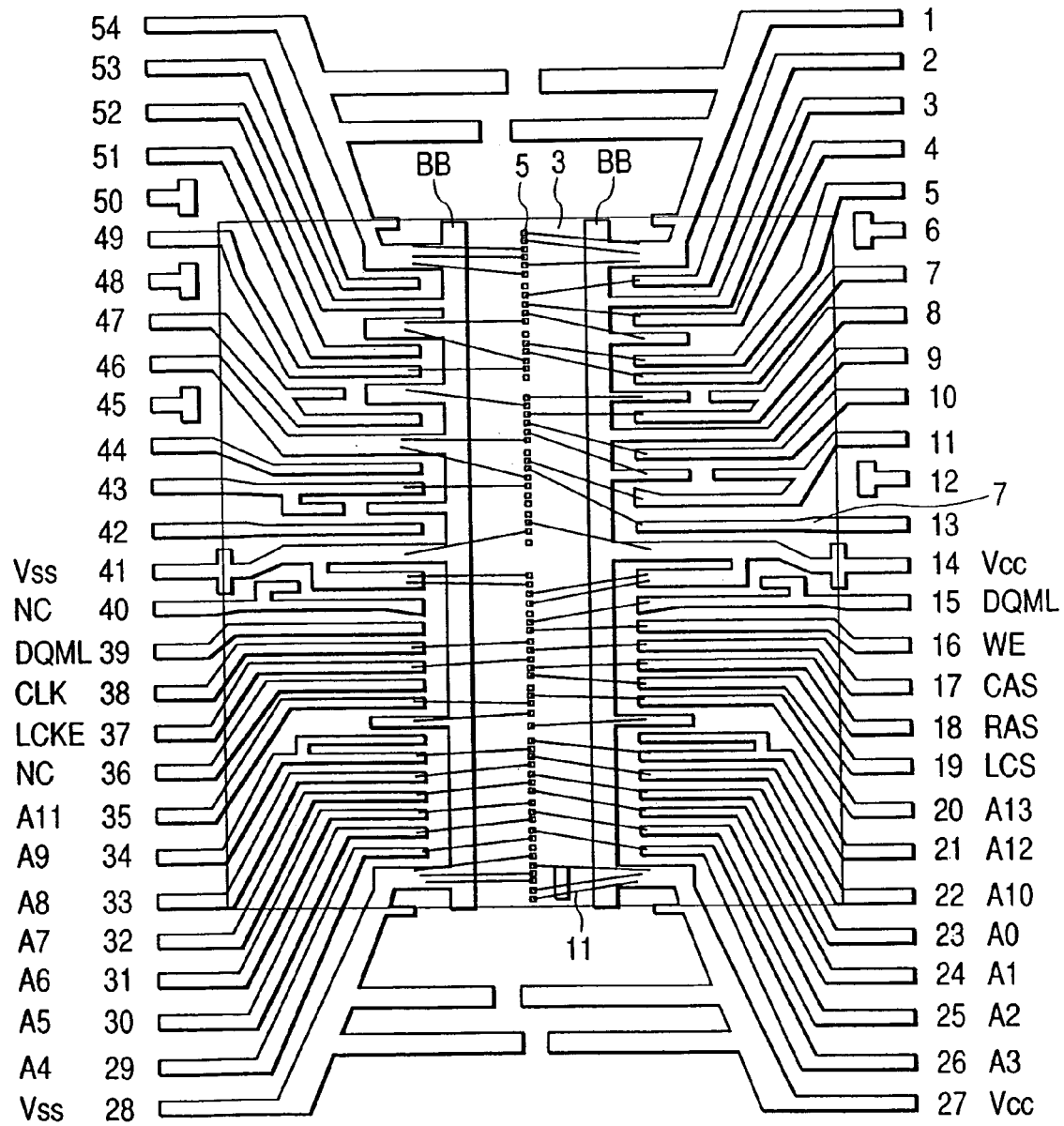
FIG. 10 is a diagram for explaining a layout of the internal structure in the semiconductor chip side laminated at the lower part of the other embodiment of the present invention.

Moreover, in the semiconductor chip 3, as illustrated in FIG. 10, the bonding pad 5 is formed so that the clock enable signal LCKE is assigned to the pins to which the clock enable signal CKE of 37 pins of JEDEC is assigned, while the chip select signal LCS is assigned to the pins to which the chip select signal/CS of 19 pins of JEDEC is assigned.

The present invention has been practically explained based on the preferred embodiments thereof but the present invention is never limited thereto and allows various changes and modifications without departure from the scope of the invention.

Moreover, according to the preferred embodiments, the semiconductor device of TSOP has been described but the package shape of semiconductor device may be set to that other than TSOP and the present invention can also be applied to SIP (Single In-line Package) and ZIP (Zigzag In-line Package) of one-way lead arrangement, SOJ (Small In-line Package), SOP (Small Outline Package) of two-way lead arrangement and QFP (Quad Flat Package), QFJ (Quad Flat J-leaded Package) of four-way lead arrangement.

Moreover, each semiconductor chip included in the memory system (semiconductor device) may have the structure not sealed by resin. In addition, each semiconductor chip included in the memory system (semiconductor device) may be sealed by individual resin. In addition, a bump may be formed in place of the lead of memory system (semiconductor device).

The typical effects disclosed by the present invention will be briefly explained below.

(1) Thickness of resin sealing material can be reduced and thereby semiconductor device may also be formed thinner.

(2) Since floating capacity of lead can be reduced remarkably, electrical characteristic of semiconductor device can be improved.

(3) Since the chip control signal can be input independently to respective semiconductor chips, only one semiconductor chip not accessed may be set to the low power consumption mode and thereby power consumption of semiconductor device may be reduced remarkably.

We claim:

1. A semiconductor device comprising:
   a first semiconductor chip;
   a second semiconductor chip;
   first to third leads extending above a surface formed with bonding pads of the first semiconductor chip; and
   fourth to sixth leads extending above a surface formed with bonding pads of the second semiconductor chip,
   wherein the first lead is electrically coupled to the fourth lead,
   wherein the second lead is electrically coupled to the fifth lead,
   wherein the third lead is electrically coupled to the sixth lead,
   wherein the first semiconductor chip is electrically coupled to the first and second leads and is isolated from the third lead,
   wherein the second semiconductor chip is electrically coupled to the fourth and sixth leads and is isolated from the fifth lead,
   wherein the first and second semiconductor chips are operated based on a clock signal which is supplied to the first lead,
   wherein the first semiconductor chip changes to a low power mode based on a first clock enable signal supplied to the second lead,
   wherein the second semiconductor chip changes to a low power mode based on a second clock enable signal supplied to the third lead,
   wherein the clock signal is supplied to the fourth lead via the first lead, and wherein the second clock signal is supplied to the sixth lead via the third lead.

2. A semiconductor device according to claim 1, further comprising:
   seventh and eighth leads extending above the surface formed with bonding pads of the first semiconductor chip; and
   ninth and tenth leads extending above the surface formed with bonding pads of the second semiconductor chip,
   wherein the seventh lead is electrically coupled to the ninth lead,
   wherein the eighth lead is electrically coupled to the tenth lead,
   wherein the first semiconductor chip is electrically coupled to the seventh and eighth leads,
   wherein the second semiconductor chip is electrically coupled to the ninth and tenth leads,
   wherein the seventh lead is supplied an address signal which is commonly used by the first and second semiconductor chip,
   wherein the eighth lead is supplied with a data signal which is commonly used by the first and second semiconductor chip,
   wherein the address signal is transferred to the ninth lead via the seventh lead, and
   wherein the data signal is transferred to the tenth lead via the eighth lead.

3. A semiconductor device according to claim 2, further comprising:
   eleventh and twelfth leads extending above the surface formed with bonding pads of the first semiconductor chip; and
   thirteenth and fourteenth leads extending above the surface formed with bonding pads of the second semiconductor chip,
   wherein the eleventh lead is electrically coupled to the twelfth lead,
   wherein the thirteenth lead is electrically coupled to the fourteenth lead,
   wherein the first semiconductor chip is electrically coupled to the eleventh lead and is isolated from the twelfth lead,
   wherein the second semiconductor chip is electrically coupled to the fourteenth lead and is isolated from the thirteenth lead,
   wherein the eleventh lead is supplied with a first chip select signal,
   wherein the twelfth lead is supplied with a second chip select signal, and
   wherein the second chip select signal is supplied to the fourteenth lead via the twelfth lead.

4. A semiconductor device according to claim 3, wherein each of the first and second semiconductor chips is an SDRAM.

5. A semiconductor device according to claim 4, wherein the first and second semiconductor chips are stacked.

6. A semiconductor device according to claim 1, further comprising:
   seventh and eighth leads extending above the surface formed with bonding pads of the first semiconductor chip; and
   ninth and tenth leads extending above the surface formed with bonding pads of the second semiconductor chip,
   wherein the seventh lead is electrically coupled to the eighth lead,
   wherein the ninth lead is electrically coupled to the tenth lead,
   wherein the first semiconductor chip is electrically coupled to the seventh lead and is isolated from the eighth lead,
   wherein the second semiconductor chip is electrically coupled to the tenth lead and is isolated from the ninth lead,
   wherein the seventh lead is supplied with a first chip select signal,
   wherein the eighth lead is supplied with a second chip select signal, and
   wherein the second chip select signal is supplied to the tenth lead via the twelfth lead.

7. A semiconductor device according to claim 6, wherein each of the first and second semiconductor chips is an SDRAM.

8. A semiconductor device according to claim 7, wherein the first and second semiconductor chips are stacked.

9. A semiconductor device according to claim 1, wherein each of the first and second semiconductor chips is an SDRAM.

10. A semiconductor device according to claim 9, wherein the first and second semiconductor chips are stacked.

* * * * *